(12) United States Patent
Yoo et al.

(10) Patent No.: US 8,724,412 B2
(45) Date of Patent: May 13, 2014

(54) VOLTAGE SUPPLY CIRCUIT, SEMICONDUCTOR MEMORY DEVICE, AND OPERATING METHOD THEREOF

(75) Inventors: Pil Seon Yoo, Seoul (KR); Je Il Ryu, Seoul (KR); Duck Ju Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 43 days.

(21) Appl. No.: 13/614,056

(22) Filed: Sep. 13, 2012

(65) Prior Publication Data

US 2013/0083614 A1     Apr. 4, 2013

(30) Foreign Application Priority Data

Oct. 4, 2011    (KR) .................. 10-2011-0100712

(51) Int. Cl.
*G11C 7/12* (2006.01)
(52) U.S. Cl.
USPC ..................................... 365/203; 365/226

(58) Field of Classification Search
USPC .................................................. 365/203, 226
See application file for complete search history.

(56) References Cited

U.S. PATENT DOCUMENTS 7,242,624 B2 * 7/2007 Kolla et al. ............. 365/189.08
2004/0083329 A1 * 4/2004 Osada et al. ................. 711/1

* cited by examiner

*Primary Examiner* — Michael Tran
(74) *Attorney, Agent, or Firm* — William Park & Associates Patent Ltd.

(57) ABSTRACT

A voltage supply circuit includes a high voltage generator configured to generate an operating voltage, a global word line switch configured to transfer the operating voltage to global word lines, a plurality of local line switches coupled to the global word lines and configured to transfer the operating voltage to corresponding local word lines, a precharge unit configured to supply a precharge voltage to an unselect local line switch adjacent to a select local line switch to which the operating voltage will be supplied, from among the plurality of local line switches, in a preparation section before an operation is started, and a coupling unit configured to couple the unselect local line switch and the global word line switch when the operation is started.

22 Claims, 4 Drawing Sheets

VOLTAGE SUPPLY CIRCUIT, SEMICONDUCTOR MEMORY DEVICE, AND OPERATING METHOD THEREOF

CROSS-REFERENCE TO RELATED APPLICATION

The present application claims priority under 35 U.S.C. §119(a) to Korean patent application number 10-2011-0100712 filed on Oct. 4, 2011, in the Korean Intellectual Property Office, which is incorporated herein by reference in its entirety as set forth in full.

BACKGROUND

1. Field of the Invention

Example embodiments relate to a voltage supply circuit and a semiconductor memory device and, more particularly, to a voltage supply circuit and a semiconductor memory device which are capable of quickly raising an operating voltage.

2. Description of the Related Art

A semiconductor memory device requires a plurality of operating voltages (e.g., a program voltage, a read voltage, an erase voltage, and a pass voltage) in a program operation, a read operation, and an erase operation.

An external power source is raised by a pump circuit because the operating voltages are much higher than the external power source.

A pump capacitor occupies most of the area of the pump circuit. The size of the pump capacitor typically depends on a load of an output node. The load of the output node may include a load due to global word lines, a load due to local lines, and a load due to a junction capacitor of a pass transistor within a row decoder corresponding to each memory block.

As the degree of integration of memory devices increases, the number of global word lines is increased and a load caused by the global word lines is also greatly increased. There are two main methods of minimizing global word line loads. The first method is a half string method of reducing a line load. The second method involves reducing a junction capacitor load of a turned-off pass transistor by reducing the number of global word lines coupled to a memory block. Although these are the types of methods that are typically used, the line and junction capacitor loads cannot be greatly reduced and a pass voltage (VPASS) rising time is not greatly reduced.

BRIEF SUMMARY

In accordance with example embodiments, a pass voltage used to drive a large load can be quickly raised by using a method of redistributing charges stored in a line capacitor.

A voltage supply circuit according to an aspect of the present disclosure includes a global word line switch configured to transfer an operating voltage to global word lines, a plurality of local line switches coupled to the global word lines and configured to transfer the operating voltage to corresponding local word lines, a precharge unit configured to supply a precharge voltage to an unselect local line switch adjacent to a select local line switch to which the operating voltage will be supplied, from among the plurality of local line switches, in a preparation section before an operation is started, and a coupling unit configured to couple the unselect local line switch and the global word line switch when the operation is started.

A semiconductor memory device according to another aspect of the present disclosure includes a plurality of memory blocks, a global word line switch configured to transfer the operating voltage to global word lines where the operating voltage is necessary for a program operation or a program verify operation, a plurality of local line switches each coupled to the global word lines and configured to transfer the operating voltage to each of local word lines, a plurality of block switches configured to couple the respective local word lines and word lines of the respective memory block, a precharge unit configured to supply the precharge voltage to an unselect local line switch adjacent to a select local line switch for which the program operation or the program verify operation will be performed, from among the plurality of local line switches, in a preparation section prior to the program operation or the program verify operation, and a coupling unit configured to couple the unselect local line switch and the global word line switch when the program operation or the program verify operation is started.

An operating method of a semiconductor memory device according to yet another aspect of the present disclosure includes discharging a select local word line to which an operating voltage will be supplied, from among a plurality of local word line a coupled to respective global word lines, before an operation is performed and precharging an unselect local word line adjacent to the select local word line, coupling the select local word line group and the unselect local word line group, and performing the operation by supplying the operating voltage to the select local word line group.

DESCRIPTION OF EMBODIMENTS

Hereinafter, some example embodiments of the present disclosure will be described in detail with reference to the accompanying drawings. The figures are provided to allow those having ordinary skill in the art to understand a scope of the embodiments of this disclosure.

Figure 1:
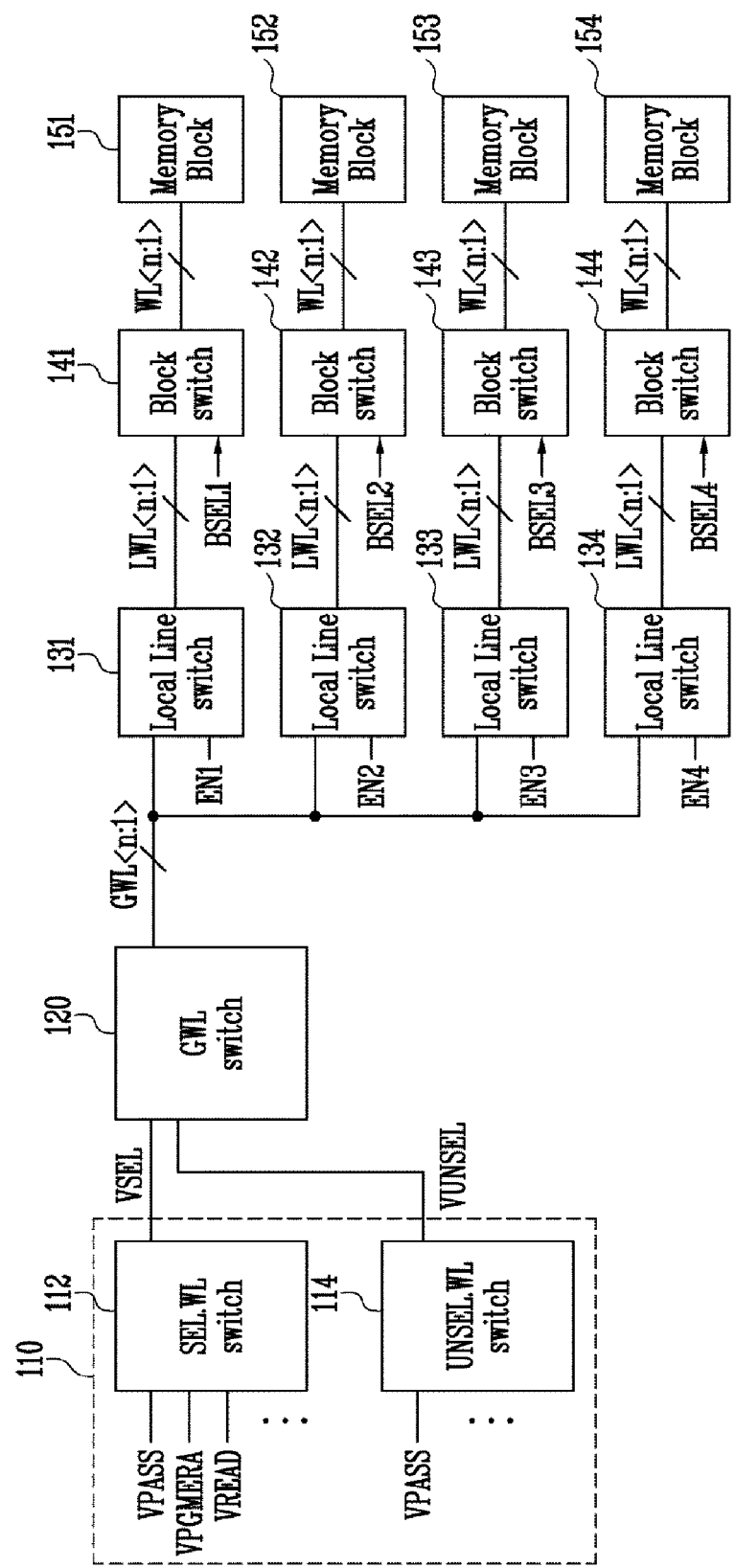
FIG. 1 is a block diagram illustrating a semiconductor memory device according to a first embodiment of this disclosure.

FIG. 1 is a block diagram illustrating a semiconductor memory device according to a first embodiment of this disclosure.

Referring to FIG. 1, a semiconductor memory device 100 includes a high voltage generator 110, a global word line (GWL) switch 120, a plurality of local line switches 131-134, a plurality of block switches 141-144, and a plurality of memory blocks 151-154.

In an embodiment, a voltage supply circuit may include the high voltage generator 110, the GWL switch 120, and the plurality of local line switches 131-134.

In an embodiment, there may be four each of local line switches 131 to 134, block switches 141 to 144, and memory blocks 151 to 154, but this number is used only for purposes of explanation. The number of each of the local line switches 131 to 134, the block switches 141 to 144, and the memory blocks 151 and 154 may be properly selected according to circumstances. Accordingly, different embodiments may comprise a different number of local line switches, block switches, and memory blocks.

The high voltage generator 110 generates a plurality of operating voltages (e.g., a program voltage VPGM, a pass voltage VPASS, a read voltage VREAD, and an erase voltage VERA) necessary for a program operation, a read operation, a program verify operation, etc. of the semiconductor memory device. The high voltage generator 110 includes a plurality of high voltage pump circuits. Each of the high voltage pump circuits includes a pump capacitor. The high voltage generator 110 includes a select word line (SEL WL) switch 112 for supplying a select voltage VSEL to the GWL switch 120 and an unselected word line (UNSEL WL) switch 114 for supplying an unselect voltage VUNSEL to the GWL switch 120.

The GWL switch 120 selectively supplies operating voltages of the high voltage generator 110 to global word lines GWL<n:1>. More specifically, the GWL switch 120 selectively supplies the select voltage VSEL of the SEL WL switch 112 and the unselect voltage VUNSEL of the UNSEL WL switch 114 to the global word lines GWL<n:1>.

The local line switches 131-134 couple the global word lines GWL<n:1> and the local word lines LWL<n:1> in response to enable signals EN1-4, respectively. The enable signals EN1-4 may be generated by a control circuit (not shown) from an address signal.

The block switches 141-144 couple the local word lines LWL<n:1> and the word lines WL<n:1> of corresponding memory blocks 151-154 in response to a block selection signal BSEL1. For example, the block switch 141 couples the local word lines LWL<n:1> and the word lines WL<n:1> of corresponding memory block 151 in response to a block select signal BSEL1.

Each of the block switches 141-144 may include a plurality of high voltage transistors which are turned on in response to the block select signal BSEL1.

In a known art, the global word lines GWL<n:1> are coupled to the memory blocks through the block switches 141-144. The semiconductor memory device 100 of this disclosure, however, includes the local line switches 131-134. Thus, in the semiconductor memory device of this disclosure, a load capacitance can be reduced by coupling the local word lines LWL<n:1> and the memory block 151 through the block switch 141.

Figure 2:
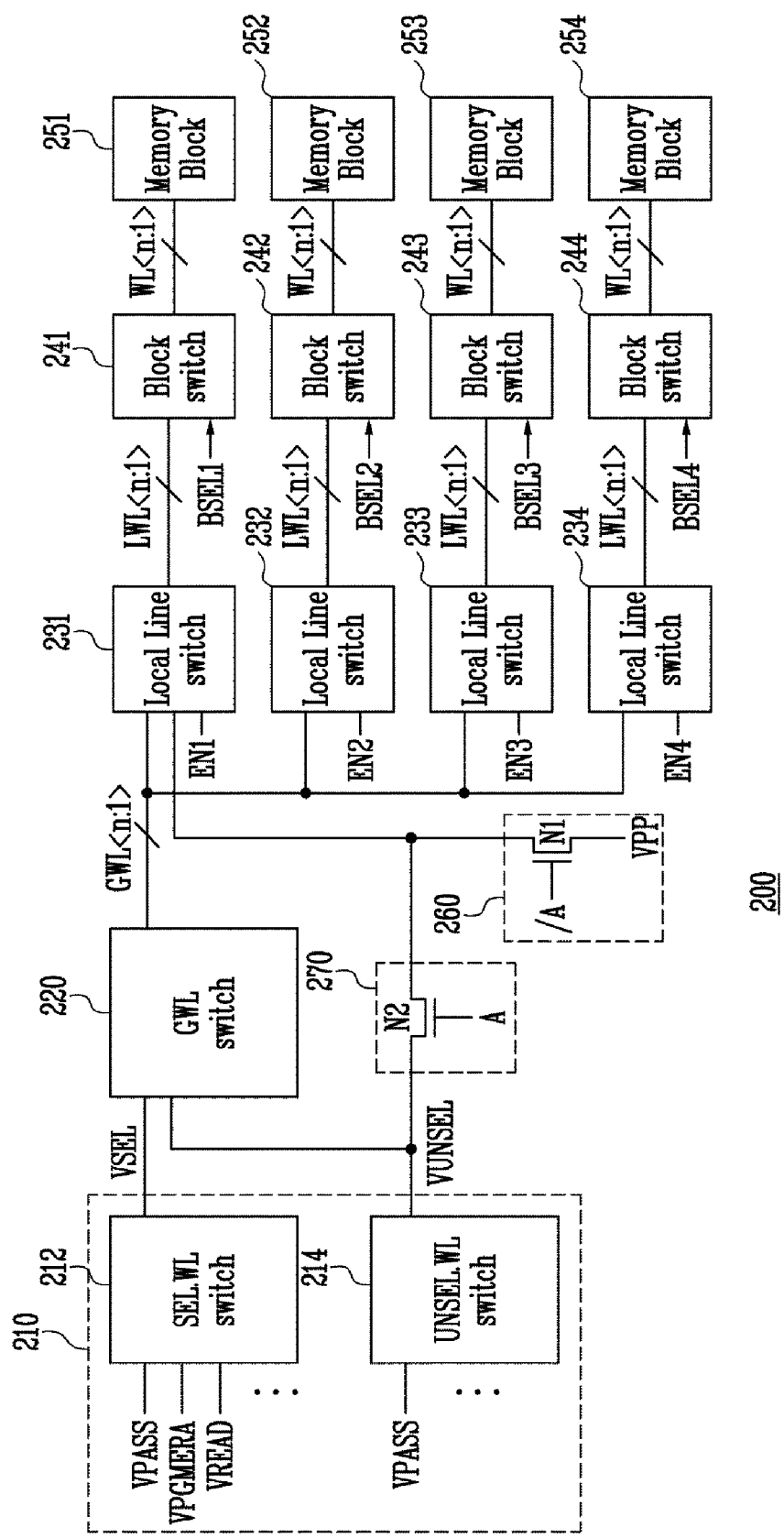
FIG. 2 is a block diagram illustrating a semiconductor memory device according to a second embodiment of this disclosure.

FIG. 2 is a block diagram illustrating a semiconductor memory device according to a second embodiment of this disclosure.

Referring to FIG. 2, the semiconductor memory device 200 includes a high voltage generator 210, a GWL switch 220, a plurality of local line switches 231-234, a plurality of block switches 241-244, a plurality of memory blocks 251-254, a precharge unit 260, and a coupling unit 270.

In an embodiment, a voltage supply circuit may include the high voltage generator 210, the GWL switch 220, and the plurality of local line switches 231-234.

In an embodiment, there may be four each of local line switches 231 to 234, block switches 241 to 244, memory blocks 251 and 254, but this number is used only for purposes of illustration. The number of each of the local line switches 231 to 234, the block switches 241 to 244, and the memory blocks 251 and 254 may be properly selected according to circumstances.

The GWL switch 220, the plurality of local line switches 231-234, the plurality of block switches 241-244, the plurality of memory blocks 251-254 have a substantially similar construction as those of FIG. 1. Therefore, redundant descriptions of these components is omitted for simplicity.

The precharge unit 260 supplies a precharge voltage VPP to an unselect local line switch 231 adjacent to a select local line switch 232 to which an operating voltage will be transmitted (i.e., on which a program operation or a verify operation will be performed), in a preparation section prior to the program operation or the program verify operation. The precharge unit 260 includes a first switching element for supplying the precharge voltage VPP to the unselect local line switch 231 in response to a precharge voltage supply signal /A. The first switching element may be formed of an NMOS transistor N1 having a gate to which the precharge voltage supply signal /A is supplied, a drain coupled to a precharge voltage terminal, and a source coupled to the unselect local line switch 231.

When the program operation or the program verify operation is started (i.e., the supply of the precharge voltage VPP is cut off), the coupling unit 270 couples the unselect local line switch 231 and the GWL switch 220. Furthermore, when the program operation or the program verify operation is started, the coupling unit 270 may couple the precharge voltage supply line of the precharge unit 260 and the GWL switch 220 so that the select local line switch 232 and the unselect local line switch 231 are coupled. Furthermore, when the supply of the precharge voltage VPP is cut off, the coupling unit 270 may couple the precharge voltage supply line and the UNSEL WL switch 214 of the high voltage generator 210 so that the precharge voltage supply line of the precharge unit 260 and the GWL switch 220 are coupled.

The coupling unit 270 includes a second switching element N2 for coupling the precharge voltage supply line of the precharge unit 260 and the GWL switch 220 in response to an inverted precharge voltage supply signal A.

An operation of the semiconductor memory device is described below.

Figure 3:
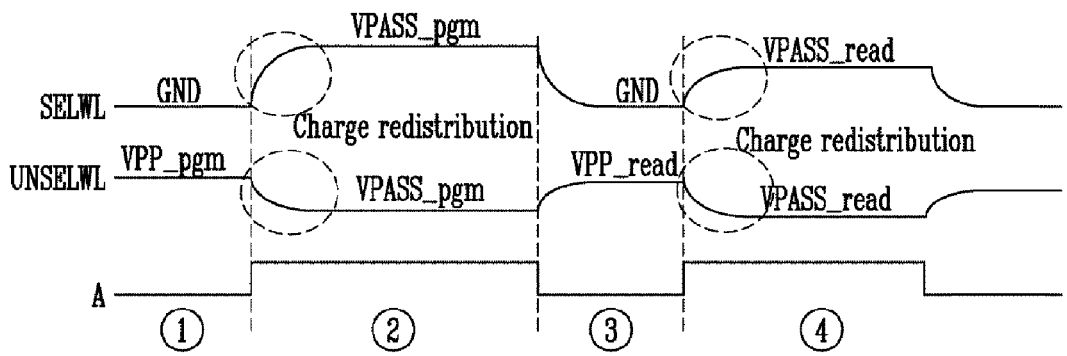
FIG. 3 is a timing diagram illustrating a change of a word line voltage when the semiconductor memory device of FIG. 2 is operated.

FIG. 3 is a timing diagram illustrating a change of a word line voltage when the semiconductor memory device of FIG. 2 is operated.

In the present embodiment, an example in which a program operation or a program verify operation for the memory cells of the second memory block 252 of the plurality of memory blocks 251-254 is performed by supplying the program voltage VPGM, the pass voltage VPASS, or a program verify voltage is described.

First, the second local line switch 232 is selected from among the plurality of local line switches 231 to 234 in response to an enable signal generated from an address signal, and the second block switch 242 is selected from among the plurality of block switches 241 to 244 in response to the block select signal BSEL2. The first local word line LWL1 of the local word lines LWL<n:1> is described below as an example.

Referring to FIG. 3, in preparation sections (i.e., in the section ① and the section ③ of FIG. 3) prior to the program operation or the program verify operation, the precharge voltage VPP is supplied to an unselect local line switch (i.e., the first local line switch 231) which is adjacent to the second local line switch 232. The precharge unit 260 supplies the precharge voltage VPP to the first local line switch 231 in response to the precharge voltage supply signal /A. At this time, a ground voltage 0 V is supplied to the second local line switch 232, which may result in the discharge of first local word line LWL1 of the second local line switch 232. Line capacitance (e.g., Cp) exists between the first local word line LWL1 of the first local line switch 231 and the first local word line LWL1 of the second local line switch 232 because the first local word line LWL1 of the first local line switch 231 is adjacent to the first local word line LWL1 of the second local line switch 232. Accordingly, charges corresponding to Cp*VPP are charged in the first local word line LWL1 of the first local line switch 231.

Next, in sections in which the program operation or the program verify operation is performed (i.e., the section ② and the section ④ of FIG. 3), the first local line switch 231 and the GWL switch 220 are coupled.

More specifically, when the inverted precharge voltage supply signal A is supplied to the coupling unit 270 (which is placed between the first local line switch 231 and a supply line along which the unselect voltage VUNSEL is supplied to the global word line switch 220) the first local line switch 231 is coupled to the supply line. When the program operation or the program verify operation is started, the first local line LWL1 of the first local line switch 231, in which charges are stored, is coupled to the first local line LWL1 of the second local line switch 232 because the global word lines GWL<n:1> of the GWL switch 220 are coupled to the second local line switch 232. Here, the coupling path is the first local word line LWL1 of the first local line switch 231-the first local line switch 231-the coupling unit 270-the GWL switch 220-the first global word line GWL1-the second local line switch 232-the first local line LWL1 of the second local line switch 232.

When the first local line LWL1 of the first local line switch 231, in which charges are stored, is coupled to the first local line LWL1 of the second local line switch 232 as described above, charge redistribution is generated between the two local lines. Accordingly, the pass voltage VPASS (i.e., the unselect voltage VUNSEL) rapidly rises almost vertically up to a specific voltage, and the pass voltage VPASS is settled up to a target voltage supplied by a voltage generator for the pass voltage VPASS. The reason why the first local line switch 231 is coupled to the supply line of the unselect voltage VUNSEL is that the rise of the pass voltage VPASS is limited because the supply line of the unselect voltage VUNSEL has the greatest load (i.e., the supply line of the unselect voltage VUNSEL is coupled to the global word lines). The time that the pass voltage VPASS takes to rise is very short owing to charge redistribution as described above. For this reason, the driving ability of the voltage generator itself can be increased by pushing voltage up to the pass voltage VPASS by using the voltage generator as in the existing structure in order to reduce the time that the pass voltage VPASS takes to rise.

The program operation and the program verify operation are described in more detail below.

The program voltage VPGM and the pass voltage VPASS of the high voltage generator 210 are transferred to the global word lines GWL<n:1> via the GWL switch 220. More specifically, the program voltage VPGM is supplied to a global word line (e.g., GWL<1>) selected from among the global word lines GWL<n:1>, and the pass voltage VPASS is supplied to the remaining global word lines (e.g., GWL<n:2>).

The second local line switch 232 selected in response to the enable signal couples the global word lines GWL<n:1> and the local lines LWL<n:1>.

The second block switch 242 selected in response to the block select signal BSEL2 couples the local lines LWL<n:1> and the word lines WL<n:1> of the memory block 252 so that the program voltage VPGM and the pass voltage VPASS are supplied to the word lines WL<n:1> of the memory block 252.

If the memory block is selected and the operating voltages are supplied to the selected memory block as described above, the number of each of the global word lines, the local lines, and the block switches coupled to the output terminal of the high voltage generator 210 is reduced by a quarter (i.e., ¼), thereby reducing a load of the output terminal of the high voltage generator 210. If a load of the output terminal of the high voltage generator 210 is reduced, the size of the pump capacitor included in the high voltage generator 210 can be reduced and thus the area of a non-volatile memory device can be reduced.

The precharge voltage VPP supplied in the preparation sections of FIG. 3 is changed in proportion to the pass voltage VPASS (i.e., a target voltage in each mode). This is because a first determined voltage value is varied when charge redistribution is generated by the precharge voltage VPP. In FIG. 3, the precharge voltage VPP is divided into a precharge voltage VPP_pgm for the program operation and a precharge voltage VPP_read for the program verify operation.

Figure 4:
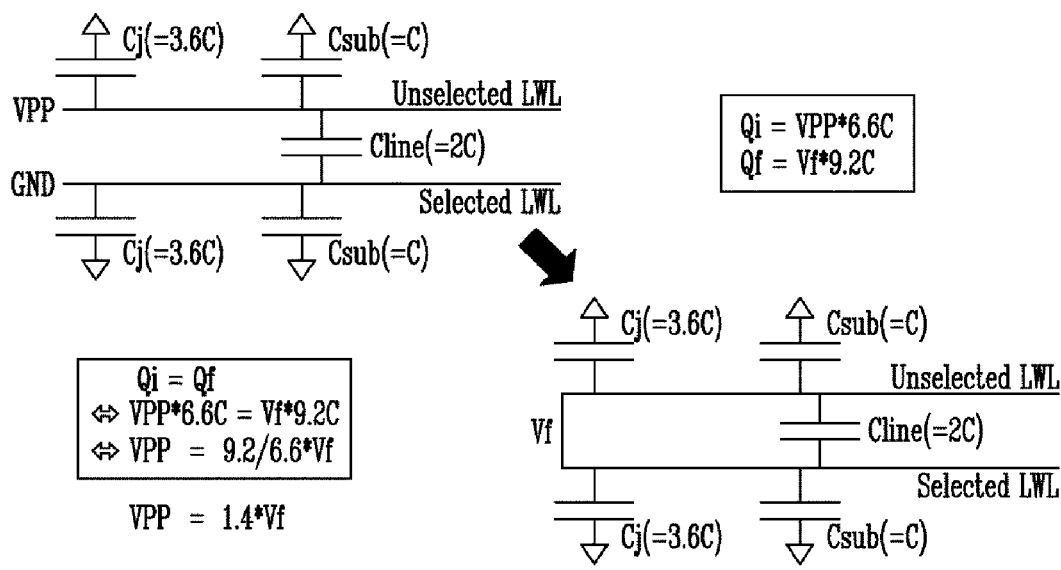
FIG. 4 is a diagram illustrating a method of calculating an amount of a precharge voltage supplied to unselected local word lines in the semiconductor memory device of FIG. 2.

FIG. 4 is a diagram illustrating a method of calculating the amount of a precharge voltage supplied to unselected local word lines in the semiconductor memory device of FIG. 2.

FIG. 4 shows a method of calculating a relationship between the precharge voltage VPP and the first determined voltage Vf when charge redistribution is generated.

Referring to FIG. 4, the relationship between the precharge voltage VPP and the first determined voltage Vf when charge redistribution is generated can be calculated by using an equation in which the amount of charges in the preparation section of the program operation and the program verify operation is equal to the amount of charges in the section where the pass voltage VPASS rises in accordance with the Conservation Law of Electrical Charges. If the precharge voltage VPP is about 1.4 times higher than the voltage Vf after the desired charge redistribution is supplied as a result of the calculation, a desired voltage Vf can be obtained.

Figure 5:
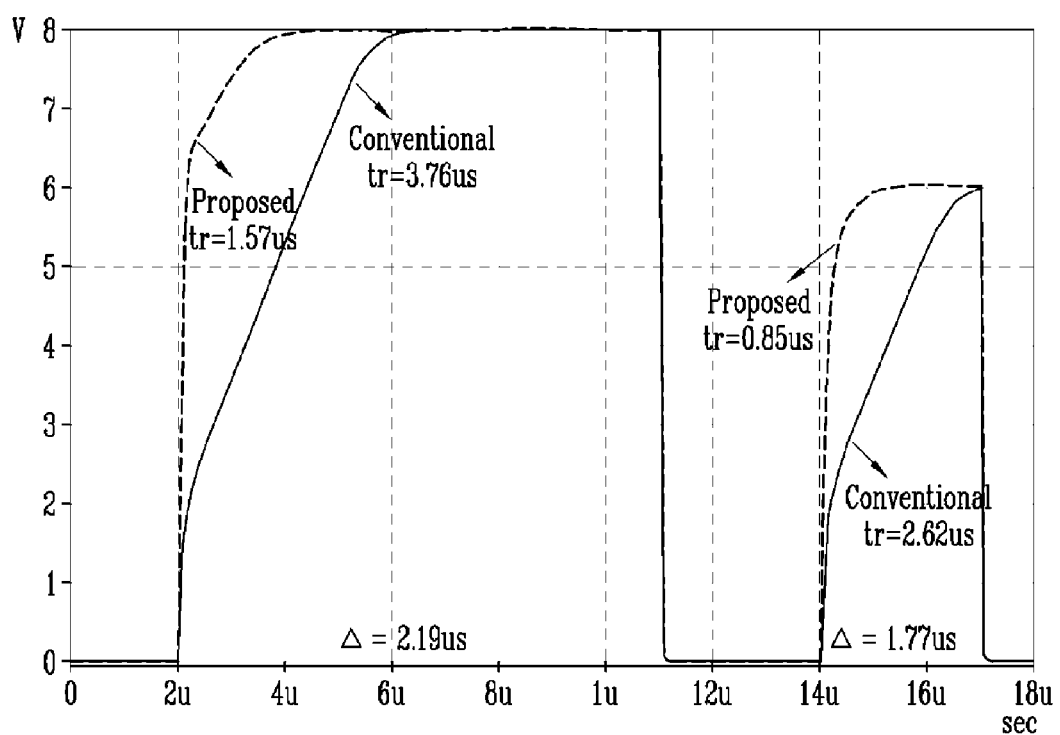
FIG. 5 is a diagram illustrating a time that the pass voltage of the semiconductor memory device shown in shown in FIGS. 1 and 2 takes to rise.

FIG. 5 is a diagram illustrating the time that the pass voltage of the semiconductor memory device shown in shown in FIGS. 1 and 2 takes to rise.

FIG. 5 shows the result of comparison between the time that the pass voltage VPASS takes to rise in the program operation and the time that the pass voltage VPASS takes to rise in the program verify operation trough simulation.

FIG. 5, shows that about 4 µs can be reduced in each program operation section because about 2.19 µs reduced in the program operation and about 1.77 µs reduced in the program verify operation. Accordingly, there is an advantage in that the driving ability of the voltage generator is increased twice or more because about 2.19 µs and about 1.77 µs are about 60 to 70% of a conventional time that the pass voltage takes to rise.

In accordance with the embodiments of this disclosure, electric charges are charged in the line capacitor by supplying a specific voltage to the local word lines of an unselect local line switch unit during the preparation sections of the program operation and the program verify operation, and the pass voltage is rapidly raised by distributing the electric charges in the section in which the pass voltage rises. Accordingly, the time that the pass voltage takes to rise can be reduced.

Consequently, the speed that the pass voltage rises can be greatly increased while maintaining the driving ability of the power source.

What is claimed is:
1. A voltage supply circuit, comprising:
a high voltage generator configured to generate an operating voltage; a global word line switch configured to transfer the operating voltage to global word lines;

a plurality of local line switches coupled to the global word lines and configured to transfer the operating voltage to corresponding local word lines;

a precharge unit configured to supply a precharge voltage to an unselect local line switch adjacent to a select local line switch to which the operating voltage will be supplied, from among the plurality of local line switches, in a preparation section before an operation is started; and a coupling unit configured to couple the unselect local line switch and the global word line switch when the operation is started.

2. The voltage supply circuit of claim 1, wherein each of the local line switches couples the global word lines and respective local word lines in response to an enable signal generated by an address signal.

3. The voltage supply circuit of claim 1, wherein when the supply of the precharge voltage is cut off, the coupling unit couples a precharge voltage supply line for supplying the precharge voltage and the global word line switch in order to couple the select local line switch and the unselect local line switch.

4. The voltage supply circuit of claim 1, wherein a high voltage generates the operating voltage and comprises:
   a select word line switch for supplying a select voltage to the global word line switch; and
   an unselect word line switch for supplying an unselect voltage to the global word line switch.

5. The voltage supply circuit of claim 4, wherein the high voltage generator further comprises:
   a first high voltage pump for supplying the high voltage to the select word line switch; and
   a second high voltage pump for supplying a pass voltage to the unselect word line switch.

6. The voltage supply circuit of claim 4, wherein when the supply of the precharge voltage is cut off, the coupling unit couples a precharge voltage supply line for supplying the precharge voltage and an unselect voltage supply line for supplying the unselect voltage to the global word line switch in order to couple the precharge voltage supply line and the global word line switch.

7. The voltage supply circuit of claim 1, wherein the precharge unit includes a first switching element for supplying the precharge voltage to the unselect local line switch in response to a precharge voltage supply signal.

8. The voltage supply circuit of claim 7, wherein the first switching element is formed of an NMOS transistor having a gate to which the precharge voltage supply signal is supplied, a drain coupled to a terminal for the precharge voltage, and a source coupled to the unselect local line switch.

9. The voltage supply circuit of claim 7, wherein the coupling unit includes a second switching element for coupling a precharge voltage supply line for supplying the precharge voltage and the global word line switch in response to an inverted precharge voltage supply signal.

10. The voltage supply circuit of claim 1, wherein the precharge unit supplies the precharge voltage which is increased in proportion to a target voltage supplied to the local word lines after the select local line switch and the unselect local line switch are coupled.

11. The voltage supply circuit of claim 1, wherein the operation includes a program operation or a program verify operation of a semiconductor memory device.

12. A semiconductor memory device, comprising:
   a plurality of memory blocks;
   a high voltage generator configured to generate an operating voltage necessary for a program operation or a program verify operation;
   a global word line switch configured to transfer the operating voltage to global word lines;
   a plurality of local line switches each coupled to the global word lines and configured to transfer the operating voltage to each of local word lines;
   a plurality of block switches configured to couple respective local word lines and word lines of a respective memory block;
   a precharge unit configured to supply a precharge voltage to an unselect local line switch adjacent to a select local line switch for which the program operation or the program verify operation will be performed, from among the plurality of local line switches, in a preparation section prior to the program operation or the program verify operation; and
   a coupling unit configured to couple the unselect local line switch and the global word line switch when the program operation or the program verify operation is started.

13. The semiconductor memory device of claim 12, wherein each of the plurality of local line switches couples respective global word lines and the respective local word lines in response to an enable signal generated by an address signal.

14. The semiconductor memory device of claim 12, wherein when the supply of the precharge voltage is cut off, the coupling unit couples a precharge voltage supply line for supplying the precharge voltage and the global word line switch in order to couple the select local line switch and the unselect local line switch.

15. The semiconductor memory device of claim 12, wherein:
   the select word line switch supplies a select voltage to the global word line switch unit, and
   the unselect word line switch supplies an unselect voltage to the global word line switch unit.

16. The semiconductor memory device of claim 15, wherein when the supply of the precharge voltage is cut off, the coupling unit couples a precharge voltage supply line for supplying the precharge voltage and an unselect voltage supply line for supplying the unselect voltage to the global word line switch in order to couple the precharge voltage supply line and the global word line switch.

17. The semiconductor memory device of claim 12, wherein the precharge unit includes a first switching element for supplying the precharge voltage to the unselect local line switch in response to a precharge voltage supply signal.

18. The semiconductor memory device of claim 17, wherein the coupling unit includes a second switching element for coupling the precharge voltage supply line and the global word line switch in response to an inverted precharge voltage supply signal.

19. The semiconductor memory device of claim 12, wherein the precharge unit supplies the precharge voltage which is increased in proportion to a target voltage supplied to the local word lines after the select local line switch and the unselect local line switch are coupled.

20. An operating method of a semiconductor memory device, comprising:
   discharging a select local word line to which an operating voltage will be supplied, from among a plurality of local word lines coupled to respective global word lines, before an operation is performed and precharging an unselect local word line adjacent to the select local word line;
   coupling the select local word line and the unselect local word line; and performing the operation by supplying the operating voltage to the select local word line.

22. The operating method of claim 20, wherein a voltage for precharging the unselect local word line is increased in proportion to a target voltage of local word lines after the select local word line and the unselect local word line are coupled.

22. The operating method of claim 20, wherein the operation includes a program operation or the program verify operation.

* * * * *